(12) United States Patent
Richter et al.

(10) Patent No.: US 7,190,605 B1
(45) Date of Patent: Mar. 13, 2007

(54) SEMICONDUCTOR MEMORY AND METHOD FOR OPERATING A SEMICONDUCTOR MEMORY COMPRISING A PLURALITY OF MEMORY CELLS

(75) Inventors: Detlev Richter, Munich (DE); Konrad Seidel, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 0 days.

(21) Appl. No.: 11/240,659

(22) Filed: Sep. 30, 2005

(51) Int. Cl.
*G11C 17/00* (2006.01)

(52) U.S. Cl. .................................. 365/94; 365/185.16

(58) Field of Classification Search ................ 365/94, 365/185.16, 100
See application file for complete search history.

(56) References Cited

U.S. PATENT DOCUMENTS

| 5,128,895 | A | | 7/1992 | Park | |
|---|---|---|---|---|---|
| 5,448,518 | A | * | 9/1995 | Jinbo | 365/185.06 |
| 5,650,959 | A | * | 7/1997 | Hayashi et al. | 365/185.16 |
| 6,477,083 | B1 | * | 11/2002 | Fastow et al. | 365/185.16 |
| 6,600,689 | B2 | * | 7/2003 | Hibino | 365/210 |
| 2006/0245233 | A1 | * | 11/2006 | Mikolajick et al. | 365/100 |

* cited by examiner

*Primary Examiner*—Anh Phung
(74) *Attorney, Agent, or Firm*—Slater & Matsil, L.L.P.

(57) ABSTRACT

A method for operating a semiconductor memory (M) including a plurality of memory cells (MC), wherein the memory cells (MC) are arranged adjacent to one another, the arrangement starts with a first memory cell (MF) and ends with a last memory cell (ML), each memory cell (MC) has a first side (S) and a second side (D), the memory cells (MC) are connected by a bitline (BL) on the first side (S) of the memory cell and connected by another bitline (BL) on the second side (D) of the memory cell, the first side (S) of a memory cell is connected to a same bitline (BL) as the second side (D) of an adjacent memory cell, each of the memory cells (MC) is connected by a same wordline (WL), including the steps of: selecting a memory cell (MC) for operation, applying a first potential (VS) to all the bitlines (BL) connected to memory cells (MC) arranged to the first side (S) of the memory cell, applying a second potential (VD) to all the bitlines (BL) connected to memory cells (MC) arranged to the second side (D) of the memory cell, and performing the desired operation on the memory cell (MC).

20 Claims, 9 Drawing Sheets

SEMICONDUCTOR MEMORY AND METHOD FOR OPERATING A SEMICONDUCTOR MEMORY COMPRISING A PLURALITY OF MEMORY CELLS

TECHNICAL FIELD

The present invention relates to a semiconductor memory and to a method for operating a semiconductor memory comprising a plurality of memory cells in such a manner that neighbor effects are minimized.

BACKGROUND

The memory cells in semiconductor memories are frequently arranged in a so-called "virtual ground array" in order to reduce the chip area required for the semiconductor memory. In such memory arrays the memory cells are arranged in rows and columns. The gates of memory cells arranged along rows are connected by a same wordline. The source/drain regions of memory cells arranged along columns are connected to the same bitlines. Each bitline is shared by memory cells of two adjacent columns of the array in order to reduce chip area.

The storage density of semiconductor memories with virtual ground arrays can be further increased by using memory cells that can store more than one bit per cell. An example of such memory cells are nitride read-only memory (NROM) cells, which are non-volatile and can store two bits per cell in a nitride layer.

Generally, when performing an operation on a memory cell, such as programming, erasing or reading, one or more of the neighboring memory cells may also be affected by the operation. This unwanted change in unselected cells is known as "neighbor effect" or as "disturb problem". In virtual ground arrays the neighbor effect is caused by sharing a bitline between two memory cells that are connected by the same wordline.

FIG. 1 is used to illustrate the neighbor effect during a read operation. The memory cell MC is selected for reading by closing the switching elements SE of the bitlines BL1 and BL2, which connect the source S and the drain D of the memory cell MC. As a result the bitline BL1 is connected to the first global bitline GB1 and the bitline BL2 is connected to the second global bitline GB2. The bitlines BL0 and BL3 of the neighboring memory cells NC, which are not shared with the memory cell MC are not connected to the global bitlines GB1 and GB2. By applying suitable potentials VS and VD to the first global bitline GB1 and to the second global bitline GB2, respectively, a current IM will flow through the memory cell MC. An erased memory cell MC allows a higher current IM to flow than a programmed cell, so that the state stored in the memory cell MC can be determined by measuring the current IM flowing through it.

Ideally, the current IS flowing into the sense amplifier SA is equal to the current IM flow through the memory cell MC. However, due to the neighbor effect a leakage current IL will leak through the neighboring memory cell NC. As a consequence, the current IS measured in the sense amplifier SA is less than the current IM flowing through the memory cell MC. If the leakage current IL is large enough, then the current IS measured may be decreased to such an extent that a programmed memory cell MC is mistakenly read as an erased cell. This will lead to reading failure of the memory as data cannot be correctly retrieved.

FIG. 2 illustrates the neighbor effect during a write operation. The structure shown is similar to the structure of FIG. 1 with the exception that the sense amplifier SA has been replaced by a bitline driver BR. Again, a memory cell MC is selected by closing the switching elements SE and connecting the bitlines BL1 to the first global bitline GB1 and the bitline BL2 to the second global bitline GB2. To program the memory cell MC suitable potentials VS and VD are applied to the first global bitline GB1 and the second global bitline GB2, respectively. At the same time a programming potential VP is applied to the wordline WL in form of pulses, which causes a programming current IP to flow. Due to the neighbor effect some of the programming current IP will leak into the neighboring cell NC. As a consequence, the current IM flowing through the memory cell MC is reduced by the leakage current IL and the programming efficiency is reduced. Depending on the magnitude of the leakage current IL, a different number of programming pulses is needed for different memory cells MC requiring complicated programming and verification algorithms to ensure that the correct state has been stored in the memory cell MC. There is, therefore, a need to reduce the influence of the neighbor effect as much as possible.

In prior art the neighbor effect problem has been solved by charging or discharging all bitlines before each operation. However, the charge/discharge operation increases the power consumption of the semiconductor memory as all the bitlines have to be charged or discharged. A further disadvantage is that the time required for operating the memory cells is increased as the charge/discharge operation must be performed before each operation and due to RC time constant involved this takes a certain time.

Other solutions to the neighbor effect problem include providing a select transistor incorporated in the memory cell. The select transistor disconnects one of the drain/source regions of the unselected memory cell from the global bitlines. However, providing a select transistor for each memory cell significantly increases the area of the memory array.

Alternatively, the leakage current has been reduced by providing isolation, so that less memory cells provide a path for the leakage current. Again, this method has an area penalty due to the area required for the isolation elements.

Another approach is to connect a smaller number of memory cells to each sense amplifier, so that less leakage currents contribute to the current measured in the sense amplifier and to reduce the time required for reading. However, providing a greater number of sense amplifiers also requires a larger chip area.

In still further solutions, complicated re/write cycles are used together with decoding in order to reduce the leakage current.

SUMMARY OF THE INVENTION

In various embodiments, the present invention provides an improved method for operating a semiconductor memory array in which the influence of neighbor effects is minimized. For example, embodiments of the present invention reduce the power consumption and increase the reading/writing performance of the semiconductor memory, without increasing the chip area required.

Accordingly, there is provided a method for operating a semiconductor memory that includes a plurality of memory cells, wherein the memory cells are arranged adjacent to one another, the arrangement starting with a first memory cell and ending with a last memory cell, each memory cell having a first side and a second side. The memory cells are coupled by a bitline on the first side of the memory cell and coupled by another bitline on the second side of the memory cell, the first side of a memory cell being coupled to a same bitline as the second side of an adjacent memory cell. Each of the memory cells is coupled by a same wordline. The method comprises the steps of selecting a memory cell for operation, applying a first potential to all the bitlines connected to memory cells arranged to the first side of the memory cell, applying a second potential to all the bitlines connected to memory cells arranged to the second side of the memory cell, and performing the desired operation on the memory cell.

By applying a first potential to all the bitlines connected to memory cells arranged to the first side of the memory cell, there is no voltage drop across the source and drain regions of the memory cells arranged to the first side of the memory cell. As a result the leakage current due to the neighbor effect is reduced. Similarly, by applying a second potential to all the bitlines connected to memory cells arranged to the second side of the memory cell, there is no potential across the source/drain region of the memory cells arranged to the second side of the memory cell. If there is no potential difference, no current will flow and the leakage current due to the neighbor effect is reduced during the desired operations, which may be read and write operations.

In accordance with a preferred embodiment, the above steps are preformed sequentially on the following memory cells of the arrangement: the first memory cell, the memory cell adjacent to the first memory cell, the memory cell adjacent to the memory cell on which the steps were last performed on and so on, until the steps have been performed on the last memory cell.

By sequentially applying a first potential to all the bitlines connected to memory cells arranged to the first side of a memory cell and applying a second potential to all the bitlines connected to memory cells arranged to the second side of the memory cell and repeating this for all the memory cells of the arrangement, starting with the first memory cell and ending with the last memory cell, only one bitline has to be charged when moving from the memory cell being operated on to the next memory cell. The other bitlines retain their previous potential. In each sweep across the arrangement of memory cells, the total number of charge/discharge operations is thus equal to the number of bitlines. This results in a reduction in the power consumption and in fast reading and writing operations, as there is no need to wait for a plurality of bitlines to be charged/discharged.

In accordance with a preferred embodiment the sequence of operations on the memory cells is repeated continuously.

This results in a continuous "sweep", that starts with the first memory cell and ends at the last memory cell in the arrangement, and then returns to the first memory cell to start further sweeps. In this way, data can be continually read out with the memory cells simply by applying a reading potential to the wordlines of the memory cell or data can be programmed into the memory cells by applying a programming potential to the wordline when the memory cell that is to be written has been selected for operation.

In accordance with a preferred embodiment, each time after the steps have been performed on the last memory cell, the first potential and the second potential are swapped.

By swapping the first potential and the second potentials the method can be used to read and write both the first bits and the second bits of NROM-memory cells. In a first sweep the first bit of each memory cell is read or programmed. Then, the first and second potentials are swapped, so that the programming direction of the NROM-cell changes. In a second sweep all the second bits of the NROM-cells are read or programmed. Before the next sweep, in which the first bits are again read or programmed, the first and second potentials are swapped again. By reading or programming first all the first bits and then all the second bits, the number of charge/discharge operations for the bitlines can be minimized and the power consumption reduced.

In accordance with a preferred embodiment, the step of performing the desired operation comprises applying a reading potential to the wordline, supplying the first potential by means of a first contact of a sense amplifier, supplying the second potential by means of a second contact of the sense amplifier and sensing the current flowing through one of the first or the second contacts of the sense amplifier.

In a read operation, all the bitlines connected to memory cells arranged to the first side of the memory cell, whose contents are to be read, are connected to a first contact of a sense amplifier. All the bitlines connected to memory cells arranged to the second side of the memory cell to be read are connected to a second contact of the sense amplifier. As a result, the leakage currents through neighboring memory cells are also measured in the sense amplifier. As the leakage currents are measured together with the current through the memory cell that is to be read, the neighbor effect is greatly reduced.

Accordance with a preferred embodiment, this step of performing the desired operation comprises supplying the first potential by means of a first contact of a bitline driver, supplying the second potential by means of a second contact of the bitline driver, and applying at least one programming potential to the wordline.

In the programming operation all the bitlines connected to memory cells arranged to the first side of the memory cell to be programmed are connected to a first contact of a bitline driver, which supplies a first potential. The first potential can be a supply voltage. All the bitlines connected to memory cells arranged to the second side of the memory cell to be programmed are connected to a second contact of the bitline driver, which supplies a second potential. The second potential can be a ground potential. Whether or not a bit in a memory cell is programmed or not is controlled by the programming potential applied to the wordline. The sweep across the memory cells runs continuously and independent from the programming data. A memory cell is programmed by applying a programming potential to the wordline when the memory cell is selected for operation.

In accordance with a preferred embodiment, in an array of memory cells arranged in rows and columns, the gates of memory cells arranged along rows are connected by a same wordline and the source/drains of memory cells arranged along columns are connected to a same bitline, with bitlines being shared by memory cells in two adjacent columns of the array. The sequence of steps of the method are preformed for the row of memory cells that is selected by a wordline decoder.

By sweeping successively each row of memory cells in the array, the method can be applied for each row, thus reducing the neighbor effect, power consumption and time required for reading or writing the memory cells of the array.

There is further provided a semiconductor memory, comprising a plurality of memory cells, a plurality of bitlines, a wordline, a plurality of first switching elements and a plurality of second switching elements. The memory cells are arranged adjacent to one another, the arrangement of memory cells starting with a first memory cell and ending with a last memory cell. Each of the memory cells is connected by the same wordline. Each memory cell has a first side and a second side, the memory cell being connected by a respective first bitline on the first side of the memory cell and being connected by a respective second bitline on the second side of the memory cell, the first side of a memory cell being connected to a same bitline as the second side of an adjacent memory cell. Each of the bitlines is connectable by means of a respective first switching element to a first contact and is connectable by means of a respective second switching element to a second contact. All the bitlines belong to either a first group of bitlines or to a second group of bitlines. The first group of bitlines comprises bitlines connected to a first group of memory cells which are adjacent to one another. The second group of bitlines comprises bitlines connected to a second group of memory cells that are adjacent to one another. The bitlines in the first group of bitlines are connected to the first contact by means of the respective first switching elements and the bitlines in the second group of bitlines are connected to the second contact by means of the respective second switching elements.

In accordance with a preferred embodiment, a control unit operates the first switching elements and the second switching elements so that the bitlines are grouped into a first group of bitlines and into a second group of bitlines, such that at first the first group of bitlines contains only the first bitline of the first memory cell and the second group of bitlines contains all the other bitlines, then, the bitline in the second group of bitlines that was adjacent to the bitline in the first group of bitlines is moved into the first group of bitlines, and the above step of moving a bitline from the second group of bitlines into the first group of bitlines is repeated until all the bitlines are in the first group.

In accordance with a preferred embodiment, the control unit continually repeats the grouping of the bitlines into a first group of bitlines and into a second group of bitlines as described above.

In accordance with a preferred embodiment a control unit operates the first switching elements and the second switching elements so that the bitlines are grouped into a first group of bitlines and into a second group of bitlines, such that at first the second group of bitlines contains only the first bitline of the first memory cell and the first group of bitlines contains all the other bitlines, then, the bitline in the first group of bitlines that was adjacent to the bitline in the second group of bitlines is moved into the second group of bitlines, the above step of moving a bitline from the first group of bitlines into the second group of bitlines is repeated until all the bitlines are in the second group.

In accordance with a preferred embodiment the control unit operates the first switching elements and the second switching elements so that the bitlines are first grouped into a first group of bitlines and into a second group of bitlines, where the first group of bitlines at first contains only the first bitline of the first memory cell and the second group of bitlines contains all the other bitlines. Then the bitline in the second group of bitlines that was adjacent to the bitline in the first group of bitlines is moved into the first group of bitlines, and the step of moving a bitline from the second group of bitlines into the first group of bitlines is repeated until all the bitlines are in the first group. Then, the bitlines are grouped into a first group of bitlines and into a second group of bitlines so that at first, the second group of bitlines contains only the first bitline of the first memory cell and the first group of bitlines contains all the other bitlines, then, the bitline in the first group of bitlines that was adjacent to the bitline in the second group of bitlines is moved into the second group of bitlines, and the step of moving a bitline from the first group of bitlines into the second group of bitlines is repeated until all the bitlines are in the second group.

In accordance with a preferred embodiment the control unit continually repeats the grouping of the bitlines into a first group of bitlines and into a second group of bitlines as described in the paragraph above.

In accordance with a preferred embodiment, the first and the second contact are contacts of a bitline driver.

In accordance with a preferred embodiment, the wordline is connected to a first potential if data representing a first state is to be written and the wordline is connected to a second potential if data representing a second state is to be written into the memory cell, wherein one of the first and second bitlines of the memory cell is in the first group of bitlines and the other of the first and second bitlines of the memory cell is in the second group of bitlines.

In accordance with a preferred embodiment the first and the second contact are contacts of a sense amplifier.

In accordance with a preferred embodiment, the wordline is connected to read potential, and the states stored in the memory cell, whose one of the first and second bitlines is in the first group of bitlines and the other of the first and second bitlines is in the second group of bitlines, is determined.

In accordance with a preferred embodiment, the memory cells are nitride read only memory cells. Nitride read only memory cells are able to store two bits per cell, which allows memories with high storage densities to be constructed.

In accordance with a preferred embodiment, further memory cells are connected to the bitlines to form a virtual ground array having columns and rows, and the further memory cells of each row are connected by further wordlines.

BRIEF DESCRIPTION OF THE DRAWINGS

The invention will now be described in more detail below by way of non-limiting examples and with reference to the accompanying drawings, in which.

The following list of reference symbols can be used in conjunction with the figures:

| | | | |
|---|---|---|---|
| 1...6 | memory cells, bits | M | memory array |
| BD | bitline decoder | MC | memory cell |
| BL0...BL6 | bitlines | MF | first memory cell |
| BR | bitline driver | ML | last memory cell |
| C | control unit | NC | neighbor memory cell |
| C1 | first contact | P | processor |
| C2 | second contact | RW | read/write unit |
| D | drain, second side of memory cell | S | source, first side of memory cell |
| DT | data | S1 | first switching element |
| G | gate | S2 | second switching element |
| G1 | first group of bitlines | SA | sense amplifier |
| G2 | second group of bitlines | SE | switching element |
| GB1 | first global bitline | VD | second potential |
| GB2 | second global bitline | VP | programming potential |
| I0...I6 | bitline currents | VR | reading potential |
| IL | leakage current | VS | first potential |
| IM | memory cell current | VWL | wordline potential |
| IP | program current | WL | wordline |
| IS | sensed current | WD | wordline decoder |

DETAILED DESCRIPTION OF ILLUSTRATIVE EMBODIMENTS

Figure 1:
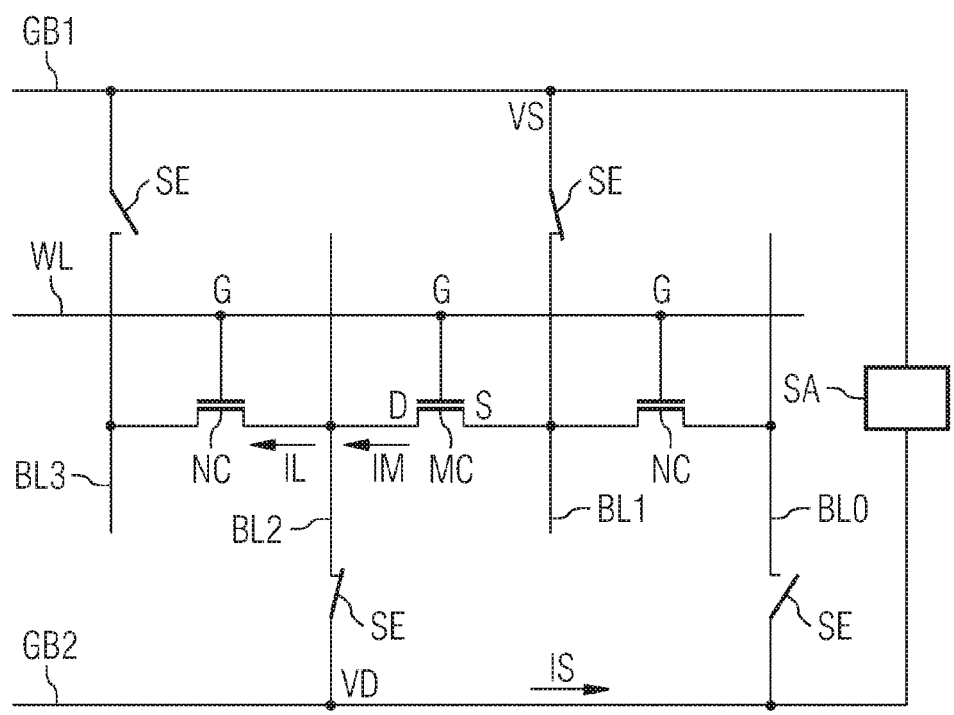
FIG. 1 illustrates the neighbor effect during a read operation.
Figure 2:
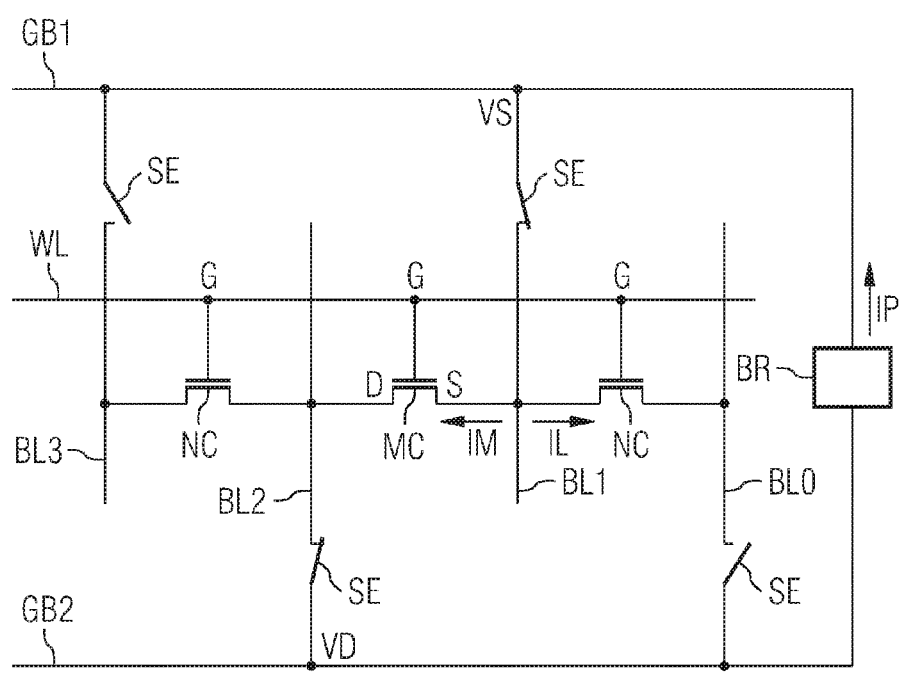
FIG. 2 illustrates the neighbor effect during a write operation.
Figure 3:
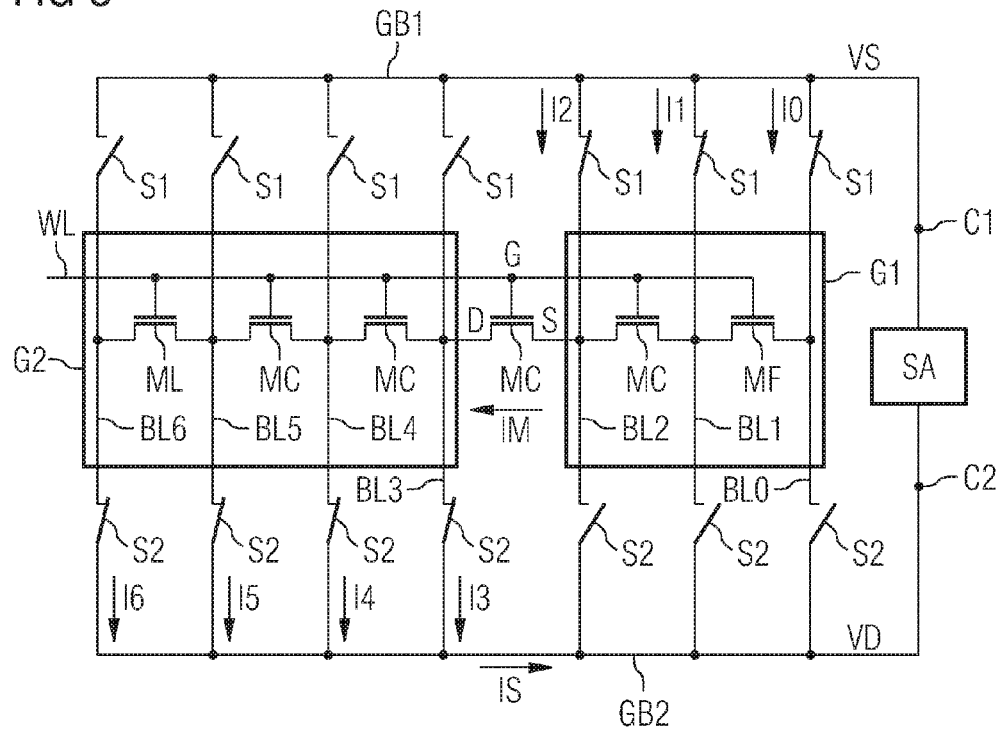
FIG. 3 shows an embodiment according to the invention for a read operation.

FIG. 3 shows an embodiment according to the invention during a read operation. Shown are six memory cells MC that are arranged adjacent to one another. The number of memory cells shown does not limit the scope of the invention, those skilled in the art will recognize that the invention can also be applied to a different number of memory cells MC, which may be arranged in a one or more rows. The memory cells MC may be any kind of non-volatile memory cells, such as floating gate or NROM. For the purpose of description the arrangement starts with a first memory cell MF and ends with a last memory cell ML. Each of the memory cells MC has a first side S and a second side D. The first side S of each memory cell MC is connected by a first bitline and the second side D of the memory cell is connected by another bitline. The first side S of a memory cell MC is connected to a same bitline as the second side D of an adjacent memory cell MC. For example, the first memory cell MF is connected on its first side S by the bitline BL0 and on its second side D by the bitline BL1. The bitline BL1 is also connected to the first side S of the memory cell MC adjacent to the first memory cell MF. The gates G of the memory cells MC are connected by a wordline WL. Each of the bitlines BL0 to BL6 is connected to a first switching element S1 and a second switching element S2. The bitlines BL0 to BL6 can be connected to a first global bitline GB1 and a first contact C1 by means of the first switching elements S1 and connected to a second global bitline GB2 and a second contact by means of the second switching elements S2. All the bitlines BL0 to BL6 are grouped in either one of a first group of bitlines G1 or a second group of bitlines G2. Bitlines in the first group of bitlines G1 are characterized by their first switching elements S1 being closed and their second switching elements S2 being opened. Bitlines in the second group of bitlines G2 are characterized by their first switching elements S1 being opened and their second switching elements S2 being closed. In the diagram shown, the bitlines BL0, BL1 and BL2 belong to the first group of bitlines G1, while the bitlines BL3, BL4, BL5 and BL6 belong to the second group of bitlines G2. The first contact C1 and the second contact C2 are used for connecting a sense amplifier SA.

For reading a memory cell MC, all the bitlines connected to memory cells MC arranged to the first side S of the memory cell MC are connected to a first potential VS by their respective first switching elements S1 and all the bitlines connected to memory cells MC arranged to the second side D of the memory cell, which is to be read, are connected to a second potential VD by means of their second switching elements S2. In the example shown the memory cell connected by the bitlines BL2 and BL3 is selected for reading. The sense amplifier SA provides the first voltage VS and the second voltage VD while the wordline WL is connected to a reading potential VR that is applied to the gates G of the memory cells MC. As a result of these potentials a current IS flows and is measured in the sense amplifier SA. Because all the bitlines in the first group of bitlines G1 are connected by the same first potential VS, there is no voltage drop across their source/drain regions so that the leakage current through these cells is greatly reduced. The currents I0 and I1 are approximately equal to 0 while the current I2 is approximately equal to the current IM through the memory cell MC to be read. As all of the bitlines in the second group of bitlines G2 are connected to the sense amplifier SA, any leakage current through the memory cells MC that are connected by bitlines in the second group of bitlines G2 is also measured by the sense amplifier SA. As the sum of the currents flowing into a node must be equal to the sum of currents flowing out of a node, the sensed current IS is equal to the current IM flowing through the memory cell MC that is to be read. As a result of the connections of all the bitlines in the first group of bitlines G1 to the first potential VS and the connection of all the bitlines in the second group of bitlines G2 to the second potential VD, the leakage due to the neighbor effect has been drastically reduced and the current sensed IS is an accurate representation of the state stored in the memory cell MC.

Figure 4:
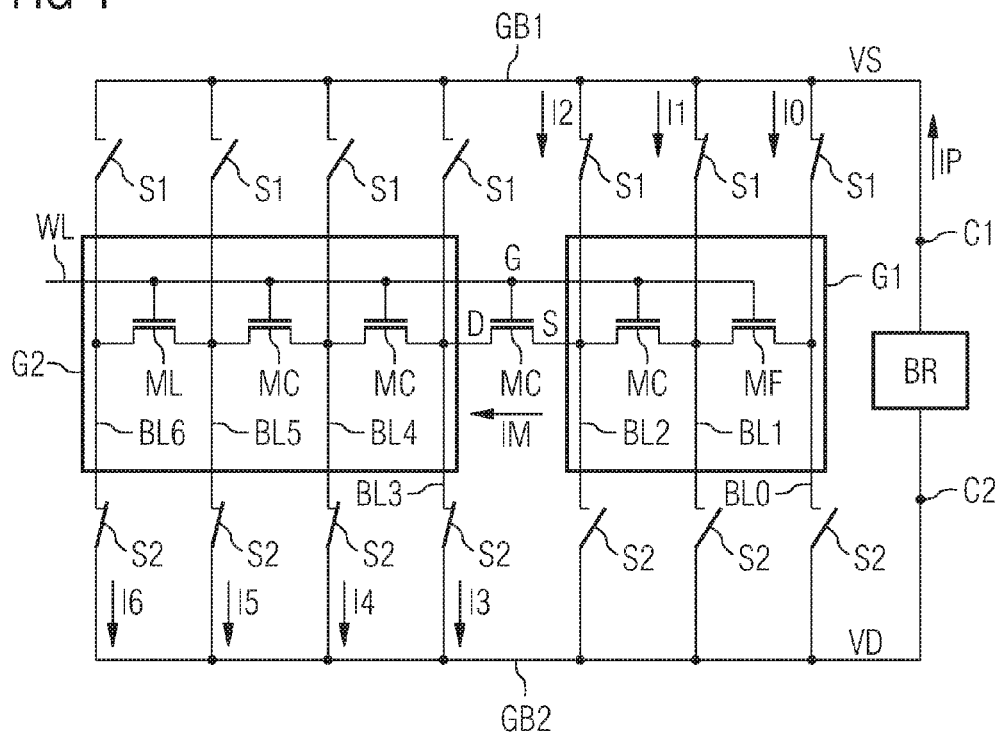
FIG. 4 shows an embodiment according to the invention for a write operation.

FIG. 4 illustrates an embodiment of the invention during a programming operation. The structure shown is similar to the structure described in FIG. 3, except that the sense amplifier SA connected between the first contact C1 and the second contact C2 has been replaced by a bitline driver BR. The first switching elements S1 and the second switching elements S2 are in the same states, forming the same group of bitlines G1 and G2 as in FIG. 3, so that repetition of the description is passed over.

For writing data into the memory cell MC the first potential VS is applied to the bitlines in the first group of bitlines G1 and a second potential VD is applied to the bitlines in the second group of bitlines G2 by means of the bitline driver BR. A programming potential VP is applied to the wordline WL. The programming potential VP may be in the form of pulses. Due to the potentials applied a programming current IP will flow. As the bitlines of the first group of bitlines G1 are connected to the same first potential VS, leakage currents through the neighboring memory cells are approximately equal to zero and the current IM flowing through the memory cell MC is approximately equal to the programming current IP: $IP=I0+I1+I2$, with $I0=I2=0$. As there is no leakage of currents the current IM through the memory cell MC that is to be programmed can be accurately set by choosing the programming current IP resulting in accurate and effective programming cycles.

Figure 5:
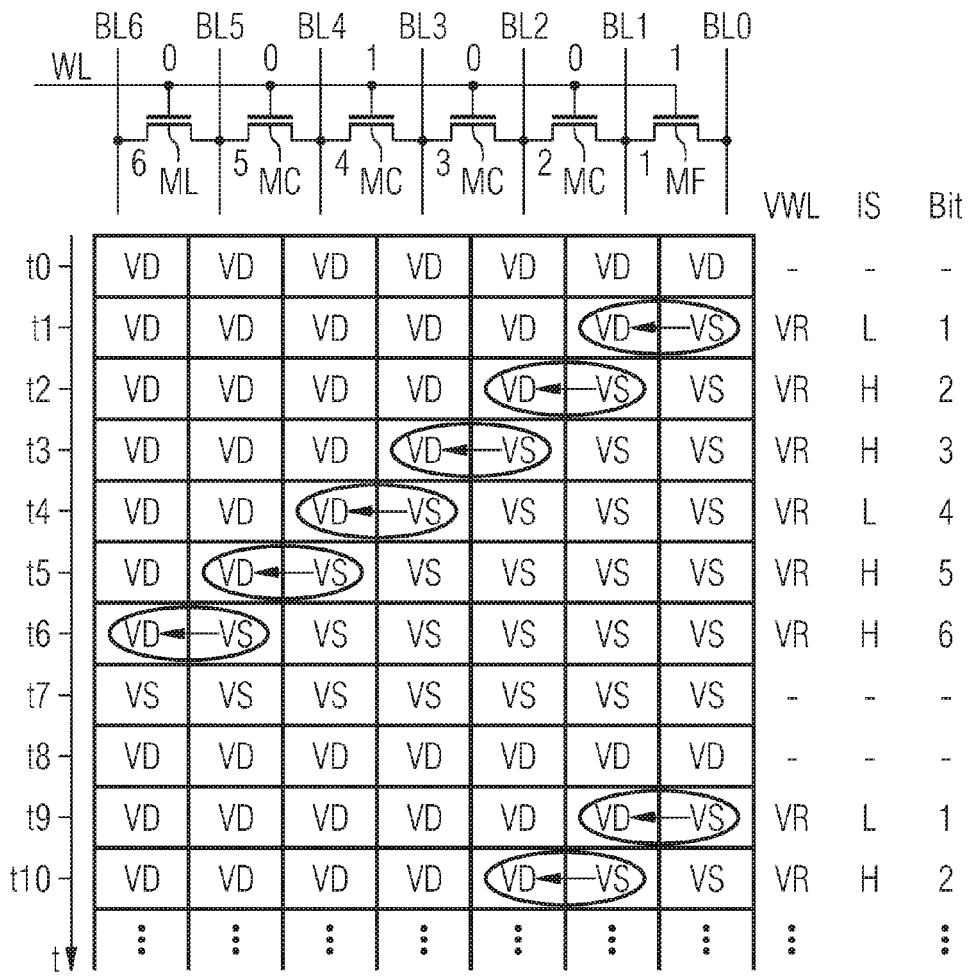
FIG. 5 shows the potentials applied to bitlines and the wordline of an embodiment according to the invention over time during read operations.

FIG. 5 illustrates the sequence of potentials applied to the bitlines and the wordline WL over time during reading operations over all the memory cells MC of the circuit shown in FIG. 3. The state stored in each memory cell is recorded above each memory cell and the bits stored in each memory cell have been numbered by the numbers 1 to 6. For example, the first memory cell MC stores the first bit that has a value of "1". Shown is further a time axis t with points t0 to t10. Typically, the time between one point in time and the next is of the order of 100 nanoseconds. The columns arranged below each of the bitlines BL0 to BL6 indicate the potential applied to each bitline at each moment in time. For example, at the time t0, a first potential VD is applied to the bitline BL0, while at time t1, a second potential VS is applied to the same bitline. The first potential VD and the second potential VS are applied to the bitlines BL0 to BL6 by operating the first switching elements S1 and the second switching elements S2. For reading, a reading potential VR is applied to the wordline WL at all points in time during which data is to be read out of a memory cell MC. The column IS represents the current measured by the sense amplifier SA. If a "1" is stored in the memory cell, the cell is programmed and a low current, indicated by "L", flows, while when the cell is not programmed, that is stores a value of "0", a high current "H" will flow. The column "Bit" indicates which of the bits is being read. For reading the state stored a memory cell, there must be a potential difference VS—VD over the memory cell MC. The direction of the potential difference across a memory cell is indicated by an arrow.

At the time t0 all the bitlines BL0 to BL6 are precharged to the second potential VD. At the time t1, bitline BL0 is at the first potential VS while all the other bitlines remain at the second potential VD. Over time the potential difference across a memory cell that is required for sensing the current flowing in that cell moves from the first memory cell MF to the adjacent memory cell, and to the next and so on, until at the time t6 the last memory cell ML is read. This process can be described by saying that the potential difference between VS and VD "sweeps" across the arrangement of memory cells.

All the bitlines to a first side S of a memory cell are connected to a first potential VS and belong to the first group of bitlines G1 while all the bitlines on the second side D of the memory cell are connected to the second potential VD and belong to the second group of bitlines G2. The first group of bitlines G1 starts with having only one bitline, BL0, at the time t1. Over time, more and more bitlines are added to the first group of bitlines G1 until at the time t7 all the bitlines belong to group G1 and none of the bitlines belong to the second group of bitlines G2. The sweeping of the potential difference across the memory cells and the grouping is repeated continuously over time. The time t9 corresponds to the time t1, the time t10 corresponds to the time t2.

It can be easily seen that only one of the bitlines BL0 to BL6 needs to be charged or discharged when moving from reading one memory cell to reading the next memory cell. Not only is the neighbor effect reduced, as was explained using FIG. 3, but also the number of charging and discharging cycles of bitlines is significantly reduced, leading to a decrease in power consumption and access times. The reading performance, that is the time required for reading all of the memory cells may be further reduced by omitting steps t0 and t7. The potentials shown at time t9 will then immediately follow those shown at the time t6, resulting in a reduction in time and requiring one less bitline to be charged. However, including the states at time t0 and t7 may lead to a simpler implementation of the control unit for operating the first switching elements S1 and the second switching elements S2.

Figure 6:
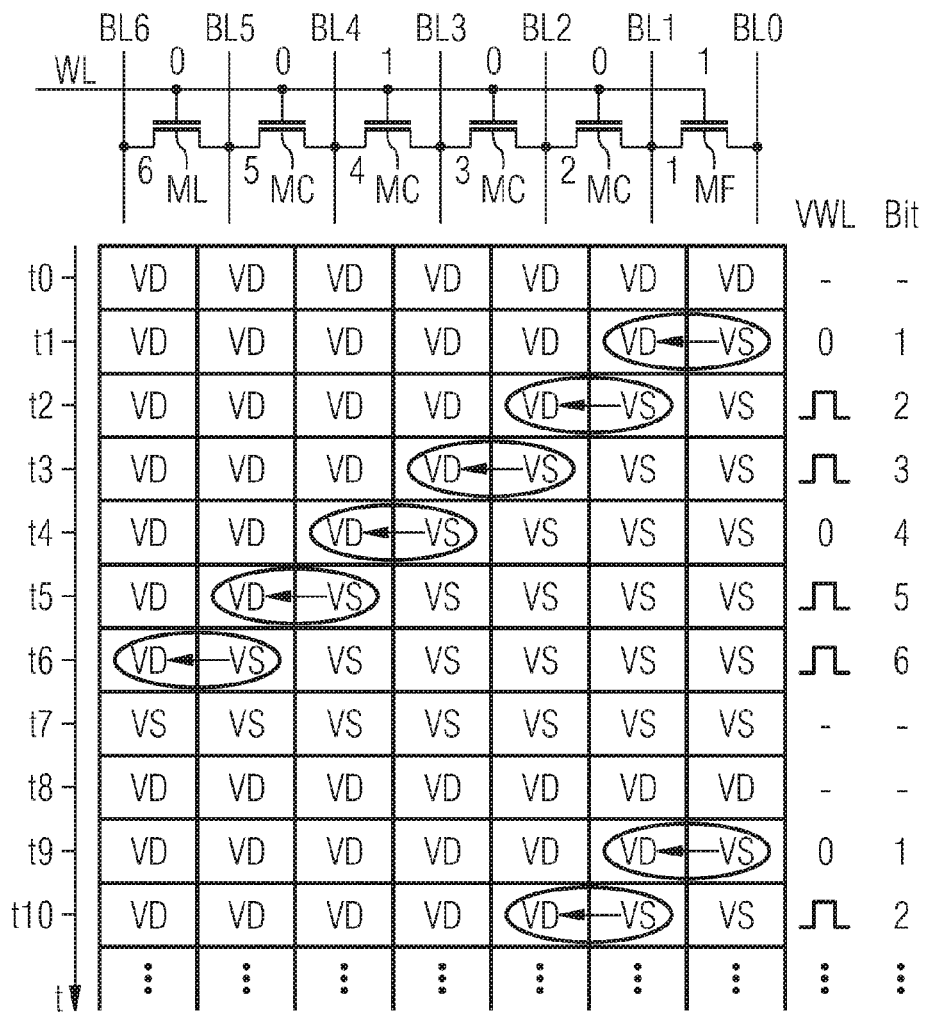
FIG. 6 shows the potentials applied to the bitlines and the wordline of an embodiment according to the invention over time during programming operations.

FIG. 6 illustrates the potentials applied to the bitlines BL0 to BL6 and the wordline WL over time during programming operations. The corresponding circuit is shown in FIG. 4. FIG. 6 is very similar to FIG. 5 so that the common features will not be described again. The main difference is that the potential applied to the wordline WL is not constant for all time points t0 to t10 but depends on the data to be written into the memory cell that is selected for programming. For example, at time t2 the memory cell between the bitlines BL1 and BL2, storing bit 2, is selected by connecting the first switching elements S1 of all the bitlines on the first side of these memory cells to a first potential VS and connecting all the bitlines on the second side of the memory cell to a second potential VD by means of their respective second switching elements S2. The information that is to be written in each memory cell is recorded above each of the memory cells. In order to store a "0" in bit 2, a programming potential VP, which may be a pulse or a plurality of pulses, has to be applied to the wordline WL, as is shown in the column VWL. At time t4 the memory cell between the bitlines BL3 and BL4 is selected for operation and a value of "1" is to be stored in bit 4. As in the reading operation a potential difference VS—VD is also required for the programming operation. In order to program a "1" into bit 4 no potential needs to be applied to the wordline WL. As already described in accordance with FIG. 5, the potential difference "sweeps" across the memory cells over time, selecting all the memory cells in sequence, starting with the first memory cell MF and ending with the last memory cell ML at the corresponding times t1 to t6. Again, leakage due to the neighbor effect is significantly reduced, as all the bitlines on a first side of the memory cell to be programmed are connected to a first potential VS and all the bitlines to the second side of the memory cell to be programmed are connected to a second potential VD. Further, as in the reading operation only one bitline needs to be charged or discharged when selecting the next memory cell for a programming operation. The first potential VS and the second potential VD during a programming operation are usually different to the first potential VS and the second potential VD during a read operation.

Figure 7:
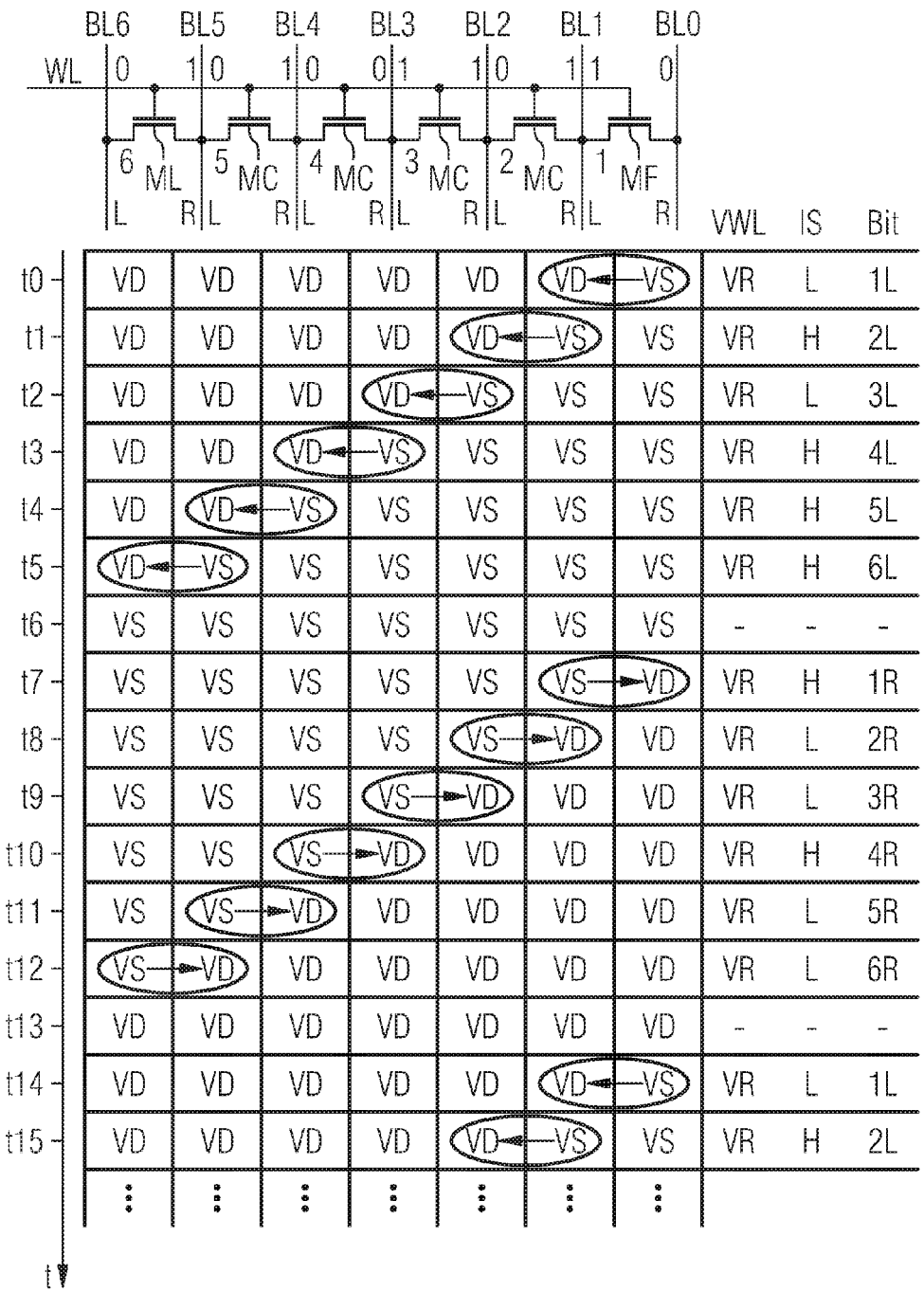
FIG. 7 shows the potentials applied to the bitlines and the wordline of an embodiment according to the invention, employing NROM-cells, over time during read operations.

FIG. 7 illustrates the potentials applied to the bitlines BL0 to BL6 and the potential applied to the wordline WL over time for an arrangement of NROM memory cells during read operations. NROM memory cells can store two bits per cell, which is indicated by adding the letters "L" and "R" below the bit number. For example the first bit (or left bit) of the first memory cell MF is designated by "1L" and the second bit (or the right bit) of the memory cell ML is designated by "6L".

The programming operation of the left bits 1L to 6L is identical to the method described in accordance with FIG. 5 so that the details will not be repeated here. The points in time t0 to t5 in FIG. 7 correspond to the points in time t1 to t7 in FIG. 5, with the step at time t0 having been omitted.

In order to program the second bit of an NROM-cell, the polarity of the bitlines to which the memory cell is connected must be reversed. These can be easily achieved, by swapping the first potential VS and the second potential VD, either inside the sense amplifier SA shown in FIG. 3 or swapping the operation of the first switching elements S1 and the second switching elements S2. In contrast to time t0, where bitline BL0 is connected to the first potential VS and bitline BL1 is connected to the second potential VD, at time t7, bitline BL0 is connected to the second potential VD and bitline BL1 is connected to the first potential VS. This may be achieved by closing the second switching element S2 to connect the bitline BL0 to the second global bitline GB2 and opening the first switching element S1 connected to the bitline BL0 so that it is disconnected from the first global bitline GB1. The sequence of potentials applied during the times t7 to t12 corresponds to the sequence at times t0 to t5 except that the first potential VS and the second potential VD have been swapped. As the polarities are reversed, so the potential difference across the memory cells will also be reversed as is indicated by the change of direction in the arrows between the first and second sweep. Bitlines in the first group of bitlines G1 are now connected to the second potential VD and bitlines in the second bitline group G2 are connected to the first potential VS. Similarly, bitline BL1 is connected by means of its first switching element S1 to the first global bitline GB1 and disconnected from the second global bitline GB2 by opening its second switching element S2.

To summarize, in a first sweep the left bits 1L to 6L of the NROM-cells are read during the times t0 to t5 and in a second sweep the right bits 1R to 6R of the NROM-cells are read at times t7 to t12. The two sweeps are repeated continuously as is indicated by the potentials at the times t14 and t15, which correspond to the potentials at the times t0 and t1. Again, the steps at times t6 and 13 may be omitted to further increase reading speed, at maybe, the expense of a simpler control unit implementation.

Figure 8:
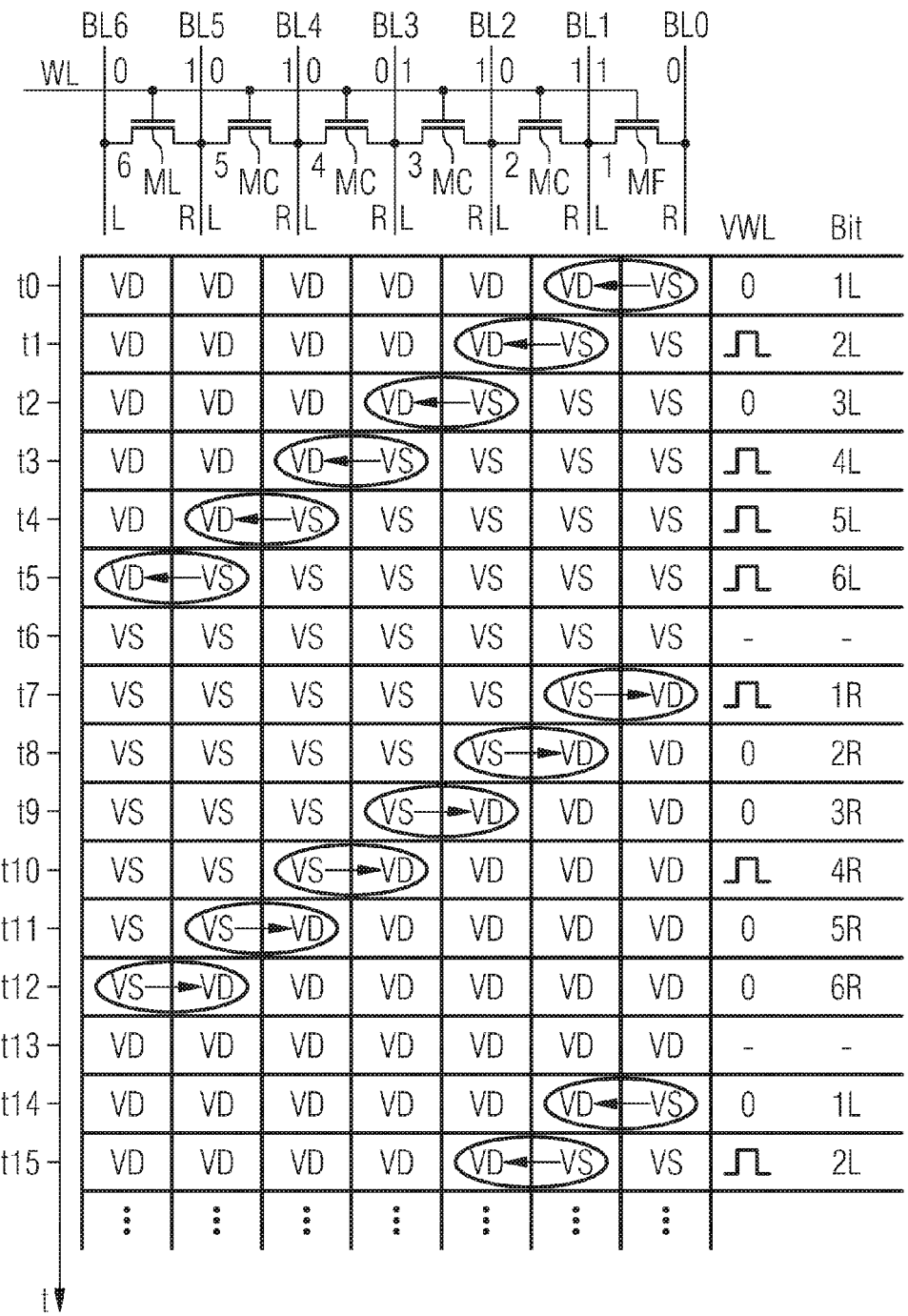
FIG. 8 shows the potentials applied to the bitlines and the wordline of an embodiment according to the invention, employing NROM-cells, over time during programming operations.

FIG. 8 illustrates the potentials applied to the bitlines BL0 to BL6 and the potential WL applied to the wordline WL over time for an arrangement of NROM-cells during program operations. The sequence of potentials applied to the bitlines is identical to that shown in FIG. 7, so that the description corresponding to FIG. 7 also applies to FIG. 8. However, as already noted when comparing FIGS. 4 and 5, the first potential VS and the second potential VD during a programming operation are generally different to those of a read operation. Instead of reading the state stored in the first and second bits of the NROM-cells, the first and second bits are programmed in FIG. 8. At times t0 to t5 the first bits 1L to 6L are programmed in a first sweep and at times t7 to t12 the second bits 1R to 6R are programmed. The programming sequence to to t13 is repeated continuously, starting again at time t14. Again, as described in conjunction with FIG. 6 programming is achieved by applying a programming voltage to the wordline WL corresponding to the data to be written during the time that a potential difference exists across the bitlines connected to the memory cell that is to be programmed.

Figure 9:
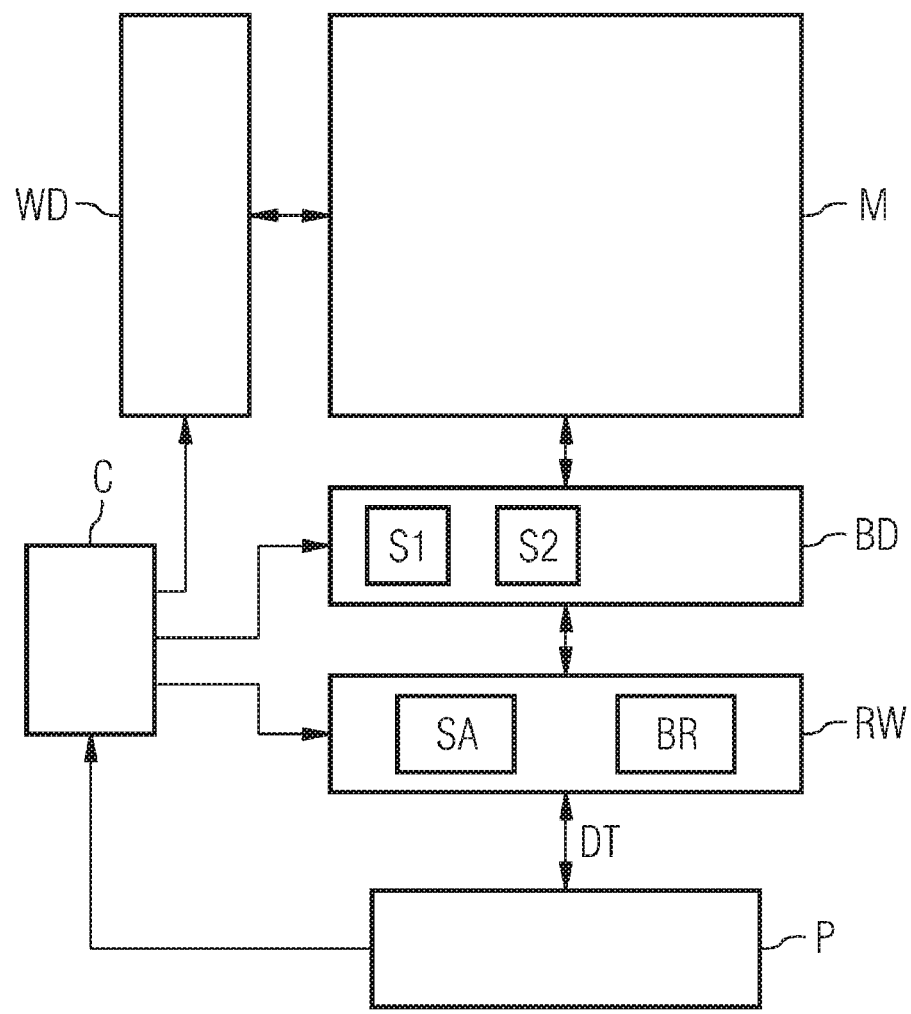
FIG. 9 shows an embodiment of a semiconductor memory according to the invention.

FIG. 9 shows an embodiment of a semiconductor memory according to the invention. A semiconductor memory array M consists of a plurality of memory cells MC, which may be non-volatile floating gate or NROM-cells. The cells are arranged in rows and columns and can be selected by means of a wordline decoder WD and a bitline decoder BD. The bitline decoder BD contains the first switching elements S1 and the second switching elements S2 for connecting the bitlines that are connected to the memory cells to a first potential VS or a second potential VD, as shown in FIGS. 3 and 4. The bitline decoder BD is further connected to a read/write unit that contains a sense amplifier SA and a bitline driver BR. Depending on the operation to be performed on the selected memory cell it is connected to the sense amplifier SA for a read operation and to the bitline driver BR for a programming operation. Data DT can be transferred between the read/write unit RW and a processor P. The processor P is connected to a control unit C and supplies address and operation information. The control unit C is then used to select the sense amplifier SA if a read operation is planned or the bitline driver BR if a write/program operation is to be performed. The control unit C further operates the first switching elements S1 and the second switching elements S2 in the bitline decoder BD to sequentially select memory cells in a role as was illustrated in FIGS. 5 to 8. Once the desired operations have been performed on a row of memory cells the control unit C selects another row for reading or programming and again operates the first and second switching elements S1, S2 to sequentially sweep the memory cells arranged in that row. The control unit C further applies the required reading potential or programming potential to the wordline WL of the role of memory cells selected and synchronizes the wordline potential with the sweeping of the memory cells, so that the required bitline potentials and the required wordline potential are applied at the same time in order to allow reading or programming of the selected cell.

The invention is especially effective in programming or reading sequential data stored in adjacent memory cells. However, it may also be applied to reading or writing memory cells, where instead of selecting adjacent memory cells one after another a different step size is used in order to improve the read/write performance. Instead of the next memory cell, the second next memory cell or even further distant memory cells may be selected.

It will be apparent to those skilled in the art that various modifications and variations can be made to the structure of the present invention without departing from the scope or the spirit of the invention. In view of the forgoing, it is intended that the present invention covers modifications and variations of this invention, provided they fall within the scope of the following claims and their equivalence.

What is claimed is:

1. A method for operating a memory device, the method comprising:
   providing a semiconductor memory that comprises a plurality of memory cells arranged adjacent to one another such that the arrangement starts with a first memory cell and ends with a last memory cell, the memory cells being coupled by a bitline on a first side of the memory cell and coupled by another bitline on a second side of the memory cell, the first side of a memory cell being coupled to a same bitline as the second side of an adjacent memory cell, each of the memory cells being coupled by a same wordline;
   selecting a memory cell for operation;
   applying a first potential to all the bitlines coupled to memory cells arranged to the first side of the memory cell;
   applying a second potential to all the bitlines coupled to memory cells arranged to the second side of the memory cell; and
   performing the operation on the memory cell.

2. The method according to claim 1, wherein the steps of selecting a memory cell, applying a first potential, applying a second potential and performing the operation are performed sequentially on the first memory cell, then on the memory cell adjacent to the first memory cell, then the memory cell adjacent to the memory cell adjacent the first memory cell, and so on, until the steps have been performed on the last memory cell.

3. The method according to claim 2, wherein the sequence of steps on the memory cells is repeated continuously.

4. The method according to claim 3, wherein each time after the steps have been performed on the last memory cell, the first potential and the second potential are swapped.

5. The method according to claim 3, wherein in an array of memory cells arranged in rows and columns, the gates of memory cells arranged along rows are coupled by a same wordline, and the source/drains of memory cells arranged along columns are coupled to a same bitline, with bitlines being shared by memory cells in two adjacent columns of the array, the sequence of steps are performed for the row of memory cells that is selected by a wordline decoder.

6. The method according to claim 1, wherein performing the operation comprises:
applying a reading potential to the wordline;
supplying the first potential by means of a first node of a sense amplifier;
supplying the second potential by means of a second node of the sense amplifier; and
sensing the current flowing through one of the first or the second nodes of the sense amplifier.

7. The method according to claim 1, wherein performing the operation comprises:
supplying the first potential by means of a first node of a bitline driver;
supplying the second potential by means of a second contact of the bitline driver; and
applying at least one programming potential to the wordline.

8. A semiconductor memory, comprising
a plurality of memory cells, a plurality of bitlines, a wordline, a plurality of first switching elements and a plurality of second switching elements, wherein:
the memory cells are arranged adjacent to one another, the arrangement of memory cells starting with a first memory cell and ending with a last memory cell;
each of the memory cells is coupled by the wordline;
each memory cell has a first side and a second side;
the memory cells being coupled to a first bitline on the first side of the memory cell and being coupled to a second bitline on the second side of the memory cell, the first side of the memory cell being coupled to a same bitline as the second side of an adjacent memory cell;
each of the bitlines is connectable by means of a respective first switching element to a first contact and is connectable by means of a respective second switching element to a second contact;
all the bitlines belong either to a first group of bitlines or to a second group of bitlines;
the first group of bitlines comprises bitlines coupled to a first group of memory cells that are adjacent to one another, and the second group of bitlines comprises bitlines coupled to a second group of memory cells that are adjacent to one another; and
the bitlines in the first group of bitlines are coupled to the first contact by means of the respective first switching elements and the bitlines in the second group of bitlines are coupled to the second contact by means of the respective second switching elements.

9. The semiconductor memory according to claim 8, further comprising a control unit that operates the first switching elements and the second switching elements so that the bitlines are grouped into the first group of bitlines and into the second group of bitlines such that:
at first, the first group of bitlines contains only a first bitline of the first memory cell and the second group of bitlines contains all the other bitlines;
then, a bitline in the second group of bitlines is moved into the first group of bitlines; and
the step of moving a bitline from the second group of bitlines into the first group of bitlines is repeated until all the bitlines are in the first group of bitlines.

10. The semiconductor memory according to claim 9, wherein the control unit continually repeats the grouping of the bitlines into a first group of bitlines and into a second group of bitlines.

11. The semiconductor memory according to claim 8, further comprising a control unit that operates the first switching elements and the second switching elements so that the bitlines are grouped into the first group of bitlines and into the second group of bitlines such that:
at first, the second group of bitlines contains only the bitline of the first memory cell and the first group of bitlines contains all the other bitlines;
then, a bitline in the first group of bitlines that was adjacent to the bitline of the first memory cell is moved into the second group of bitlines; and
the step of moving a next bitline from the first group of bitlines into the second group of bitlines is repeated until all the bitlines are in the second group of bitlines.

12. The semiconductor memory according to claim 8, further comprising a control unit that operates the first switching elements and the second switching elements so that the bitlines are grouped into the first group of bitlines and into the second group of bitlines such that:
at first, the first group of bitlines contains only the bitline of the first memory cell and the second group of bitlines contains all the other bitlines;
then, a bitline in the second group of bitlines is moved into the first group of bitlines;
then, each additional bitline from the second group of bitlines is moved one by one into the first group of bitlines until all the bitlines are in the first group of bitlines;
then, the bitline of the first memory cell is moved into the second group so that the second group of bitlines contains only the bitline of the first memory cell and the first group of bitlines contains all the other bitlines; and
then, each additional bitline from the first group of bitlines is moved one by one into the second group of bitlines until all the bitlines are in the second group of bitlines.

13. The semiconductor memory according to claim 12, wherein each bitline that is moved from one group into another group is adjacent to a bitline that was most recently moved from one group into another group.

14. The semiconductor memory according to claim 12, wherein the control unit continually repeats the grouping of the bitlines into a first group of bitlines and into a second group of bitlines.

15. The semiconductor memory according to claim 8, further comprising a bitline driver, wherein the first contact and the second contact are contacts of the bitline driver.

16. The semiconductor memory according to claim 15, wherein the wordline is coupled to a first potential if data representing a first state is to be written and the wordline is coupled to a second potential if data representing a second state is to be written into the memory cell, wherein one of the first and second bitlines of the memory cell is in the first group of bitlines and the other of the first and second bitlines of the memory cell is in the second group of bitlines.

17. The semiconductor memory according to claim 8, further comprising a sense amplifier, wherein the first contact and the second contact are contacts of a sense amplifier.

18. The semiconductor memory according to claim 17, wherein the wordline is coupled to a read potential, and the state stored in the memory cell, whose one of the first and second bitlines is in the first group of bitlines and the other of the first and second bitlines is in the second group of bitlines, is determined.

19. The semiconductor memory according to claim 8, wherein the memory cells comprise nitride read only memory cells.

20. The semiconductor memory according to claim 8, wherein further memory cells are coupled to the bitlines to form a virtual ground array having columns and rows, and the further memory cells are coupled by further wordlines.

* * * * *